(12) United States Patent
Shinohara

(10) Patent No.: US 10,659,039 B2
(45) Date of Patent: May 19, 2020

(54) SEMICONDUCTOR DEVICE

(71) Applicants:Kabushiki Kaisha Toshiba, Minato-ku, Tokyo (JP); Toshiba Electronic Devices & Storage Corporation, Minato-ku, Tokyo (JP)

(72) Inventor: Masatoshi Shinohara, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/288,395

(22) Filed: Feb. 28, 2019

(65) Prior Publication Data
US 2020/0021287 A1   Jan. 16, 2020

(30) Foreign Application Priority Data

Jul. 11, 2018   (JP) .................................. 2018-131491

(51) Int. Cl.
| | |
|---|---|
| H03B 1/00 | (2006.01) |
| H03K 17/687 | (2006.01) |
| H02J 7/00 | (2006.01) |
| H01L 29/78 | (2006.01) |

(52) U.S. Cl.
CPC ........ *H03K 17/6871* (2013.01); *H02J 7/0029* (2013.01); *H01L 29/7816* (2013.01)

(58) Field of Classification Search
CPC ....... H01L 2924/00; H01L 2924/00014; H01L 2924/1305; H01L 2924/13055; H01L 2924/48247
See application file for complete search history.

(56) References Cited

U.S. PATENT DOCUMENTS

| | | | |
|---|---|---|---|
| 7,924,540 B2 | 4/2011 | Tamegai | |
| 2010/0052052 A1* | 3/2010 | Lotfi | H01L 21/28518 257/336 |
| 2013/0154391 A1* | 6/2013 | Urciuoli | H03K 17/081 307/112 |

FOREIGN PATENT DOCUMENTS

| | | |
|---|---|---|
| JP | 5139022 B2 | 2/2013 |
| JP | 2014-030317 A | 2/2014 |
| JP | 5747727 B2 | 7/2015 |

* cited by examiner

*Primary Examiner* — Sibin Chen
(74) *Attorney, Agent, or Firm* — White & Case LLP

(57) ABSTRACT

A semiconductor device according to one embodiment comprises a first transistor, a second transistor, a switch, and a first control circuit. The first transistor including, one end of a current path connected to a first node, another end of the current path connected to a second node, and a gate connected to a third node. The second transistor including, one end of a current path connected to the second node, another end of the current path connected to a fourth node, and a gate connected to the third node. The switch configured to connect the second node and the third node. The first control circuit configured to control the switch.

18 Claims, 5 Drawing Sheets

SEMICONDUCTOR DEVICE

CROSS-REFERENCE TO RELATED APPLICATIONS

This application is based upon and claims the benefit of priority from Japanese Patent Application No. 2018-131491, filed Jul. 11, 2018, the entire contents of which are incorporated herein by reference.

FIELD

Embodiments described herein relate generally to a semiconductor device.

BACKGROUND

A power switch circuit that is provided with a function to protect a power supply destination circuit when a potential from a power supply is applied in the opposite direction, is known.

DETAILED DESCRIPTION

A semiconductor device according to one embodiment comprises a first transistor, a second transistor, a switch, and a first control circuit. The first transistor including, one end of a current path connected to a first node, another end of the current path connected to a second node, and a gate connected to a third node. The second transistor including, one end of a current path connected to the second node, another end of the current path connected to a fourth node, and a gate connected to the third node. The switch configured to connect the second node and the third node. The first control circuit configured to control the switch.

Hereinafter, embodiments will be described with reference to the accompanying drawings. In the description below, structural elements having substantially the same functions and configurations will be denoted by the same reference symbols, and repetitive explanations thereof may be omitted. Furthermore, all of the descriptions regarding a certain embodiment will apply as descriptions of another embodiment unless they are explicitly or obviously excluded.

Each function block does not necessarily have to be categorized in the manner of the following example. For example, some functions may be implemented by a function block other than the exemplary function blocks. In addition, the exemplary function blocks may be divided into further detailed function sub-blocks. The embodiments will not be limited depending on by which block they are identified.

In the specification and claims of the present application, when a certain first element is "connected" to another second element, it includes a state in which the first element is connected to the second element directly, or via an element that is always or that becomes selectively conductive.

1. Configuration

Figure 1:
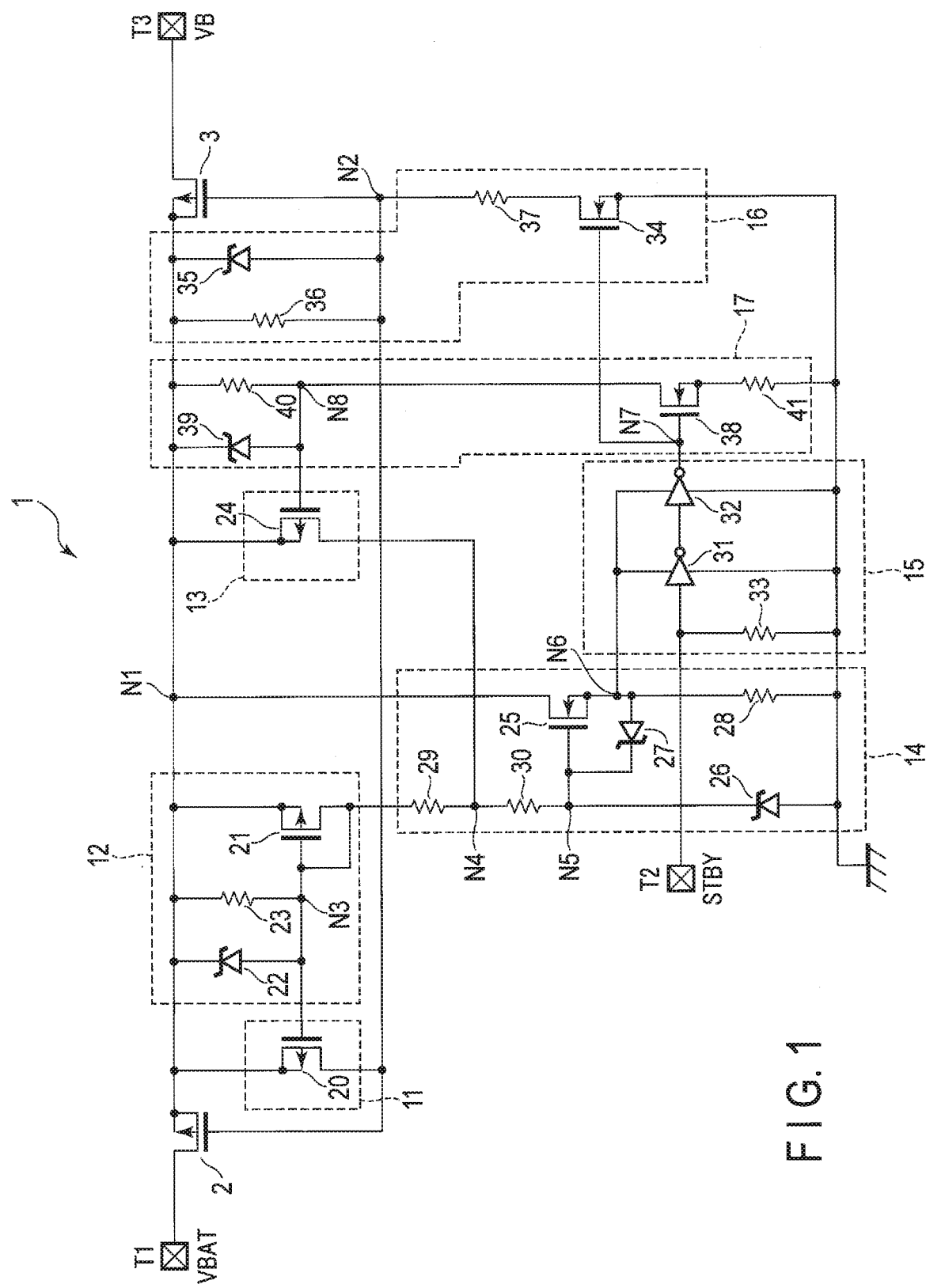
FIG. 1 is a circuit diagram of a power switch circuit according to an embodiment.

A configuration of a semiconductor device according to a present embodiment will be explained by an example of a power switch circuit with a reverse connection protection function that is a function to protect a power supply destination circuit when a potential from a power supply is applied in the opposite direction. FIG. 1 shows the power switch circuit 1 according to an embodiment.

As shown in the drawing, the power switch circuit 1 comprises MOS transistors 2 and 3, a switch 11, a first current supply circuit 12, a second current supply circuit 13, a power voltage generation circuit 14, a control logic 15, a first gate driver 16, and a second gate driver 17. The power switch circuit 1 is formed on, for example, one semiconductor chip. The power switch circuit 1 includes terminals T1, T2, and T3 that can be externally connected.

The transistors 2 and 3 are, for example, a p-type Laterally Diffused Metal Oxide Semiconductor Field Effect Transistor (LDMOSFET). The transistors 2 and 3 electrically connect or disconnect the terminal T1 and the terminal T3. In particular, the transistor 2 has a drain connected to the terminal T1, a source connected to a node N1, and a gate connected to a node N2. The transistor 3 has a source connected to the node N1, a drain connected to the terminal T3, and a gate connected to the node N2. By turning on both of the transistors 2 and 3, the terminal T1 and the terminal T3 are electrically connected.

The source and a back-gate of the transistor 2 are connected and short-circuited. The source and a back-gate of the transistor 3 are also connected and short-circuited. At the transistors 2 and 3, a parasitic diode is present between the source and the drain (the parasitic diodes are not shown in FIG. 1). The transistors 2 and 3 are connected in a manner that the parasitic diodes face opposite directions from each other. The transistors 2 and 3 should be high-voltage MOSFETs. Furthermore, usually, element isolation is performed by a trench between the transistors 2 and 3.

The switch 11 electrically connects or disconnects the node N1 and the node N2. In particular, the switch 11 comprises, for example, a p-type MOSFET transistor 20. The transistor 20 has a source connected to the node N1, drain connected to the node N2, and a gate connected to a node N3. When the transistor 20 is turned "ON", the node N1 and the node N2 are electrically connected.

The first current supply circuit 12 supplies electric current to the power voltage generation circuit 14 and controls the switch 11 based on the electric current, as follows. The first current supply circuit 12 comprises, for example, a transistor 21 that is a p-type MOSFET, a Zener diode 22, and a resistance element 23. The transistor 21 has a source connected to the node N1, and a gate and a drain connected to the node N3. The Zener diode 22 has an anode connected to the node N3, and a cathode connected to the node N1. The resistance element 23 has one end connected to the node N1, and the other end connected to the node N3. The first current supply circuit 12 supplies a drain current of the transistor 21 to the power voltage generation circuit 14. The first current supply circuit 12 also generates a voltage based on the drain current of the transistor 21 at the node N3, and controls the switch 11 based on this potential.

The second current supply circuit 13 also supplies an electric current to the power voltage generation circuit 14. In particular, the second current supply circuit 13 comprises, for example, a transistor 24 that is a p-type MOSFET. The transistor 24 has a source connected to the node N1, a drain connected to a node N4, and a gate connected to a node N8. In the present configuration, the second current supply circuit 13 supplies a drain current of the transistor 24 to the power voltage generation circuit 14.

The power voltage generation circuit 14 generates a voltage based on the current supplied from the first current supply circuit 12 and/or the second current supply circuit 13, and outputs it to a node N6, as described in later. The power voltage generation circuit 14 comprises, for example, a transistor 25 that is an n-type MOSFET, Zener diodes 26 and 27, and resistance elements 28, 29, and 30. The resistance element 29 has one end connected to the node N3, and the other end connected to the node N4. The resistance element 30 has one end connected to the node N4, and the other end connected to a node N5. The Zener diode 26 has an anode grounded, and a cathode connected to the node N5. The transistor 25 has a source connected to the node N6, a drain connected to the node N1, and a gate connected to the node N5. The Zener diode 27 has an anode connected to the node N6, and a cathode connected to the node N5. The resistance element 28 has one end connected to the node N6, and the other end grounded.

In the above configuration, when the first current supply circuit 12 and/or the second current supply circuit 13 supply an electric current to the power voltage generation circuit 14, a voltage drop occurs at the Zener diode 26. A voltage that is generated at both ends of this Zener diode 26 is applied to a gate of the transistor 25. When the transistor 25 is turned "ON" by this voltage, a drain current of the transistor 25 flows to the resistance element 28, and a voltage drop occurs at the resistance element 28. The power voltage generation circuit 14 supplies the voltage of the node N6 generated by the voltage drop at the resistance element 28 to the control logic 15 as a power supply voltage. When an electric current is supplied from the second current supply circuit 13, the power voltage generation circuit 14 turns off the transistor 21 of the first current supply circuit 12 by the voltage drop occurring at the resistance elements 29 and 30.

The control logic 15 controls the first gate driver 16 and the second gate driver 17 based on a signal STBY, as described in later. The control logic 15 comprises inverters 31 and 32 and a resistance element 33. The resistance element 33 has one end connected to the terminal T2, and the other end grounded. The inverter 31 has a positive power supply terminal connected to the node N6, a negative power supply terminal grounded, an input terminal connected to the terminal T2, and an output terminal connected to an input terminal of the inverter 32. The inverter 32 has a positive power supply terminal connected to the node N6, a negative power supply terminal grounded, and an output terminal connected to a node N7. The signal STBY is input to the terminal T2 from outside. The signal STBY is a digital signal that has, for example, two logical levels of an "H" level and an "L" level. The power switch circuit 1 transfers the voltage applied to the terminal T1 to the terminal T3 based on the signal STBY. The operation will be explained in detail later on in item "2. Operation".

In the above configuration, the inverters 31 and 32 operate by using the voltage the power voltage generation circuit 14 outputs from the node N6, as a positive power supply voltage. The inverter 31 then inverts the signal STBY, and the inverter 32 inverts the output of the inverter 31 and outputs the inverted result to the node N7. The output signal of the inverter 32 at the node N7 is then supplied to the first gate driver 16 and the second gate driver 17.

The first gate driver 16 controls the gate potentials of the transistors 2 and 3 based on the output signal of the inverter 32, that is, the potential of the node N7, as described in later. The first gate driver 16 comprises, for example, a transistor 34 that is an n-type MOSFET, a Zener diode 35, and resistance elements 36 and 37. The resistance element 36 has one end connected to the node N1, and the other end connected to the node N2. The resistance element 37 has one end connected to the node N2, and the other end connected to a drain of the transistor 34. The transistor 34 has a source grounded, and a gate connected to the node N7. The Zener diode 35 has an anode connected to the node N2, and a cathode connected to the node N1.

In the above configuration, in the first gate driver 16, when the potential of the node N7 is at the "H" level, the transistor 34 is turned "ON", and the drain current flows through the resistance elements 36 and 37. Then, a voltage VGS is generated between the node N1 and the node N2 by the voltage drop occurring at the resistance element 36, and the transistors 2 and 3 are turned on. On the other hand, when the potential of the node N7 is at the "L" level, the transistor 34 is turned "OFF". In such case, the voltage drop does not occur at the resistance element 36, and the node N1 and the node N2 come to have the same potential. Thereby, the transistors 2 and 3 are turned "OFF".

The second gate driver 17 controls the second current supply circuit 13 based on the output signal of the inverter 32, that is, the potential of the node N7, as described in later. The second gate driver 17 comprises, for example, a transistor 38 that is an n-type MOSFET, a Zener diode 39, and resistance elements 40 and 41. The resistance element 40 has one end connected to the node N1, and the other end connected to the node N8. The Zener diode 39 has an anode connected to the node N8, and a cathode connected to the node N1. The transistor 38 has a source connected to one end of the resistance element 41, a drain connected to the node N8, and a gate connected to the node N7. The other end of the resistance element 41 is grounded.

In the above configuration, in the second gate driver 17, when the potential of the node N7 is at the "H" level, the transistor 38 is turned "ON", and the drain current flows through the resistance element 40. The voltage drop occurring at the resistance element 40 then generates a positive voltage at the node N8, and turns "ON" the transistor 24 of the second current supply circuit 13. On the other hand, when the potential of the node N7 is at the "L" level, the transistor 38 is turned "OFF". In such case, the voltage drop does not occur at the resistance element 40, and the node N1 and the node N8 become the same potential. Thereby, the transistor 24 is turned "OFF".

2. Operation

The operation of the power switch circuit 1 mentioned above will now be explained. In the following, three cases will be explained. That is:

(1) in a case where a positive potential is applied to the terminal T1, and the signal STBY is at the "L" level;

(2) in a case where a positive potential is applied to the terminal T1, and the signal STBY is at the "H" level; and (3) in a case where a negative potential is applied to the terminal T1.

2.1 Case (1) Above

Figure 2:
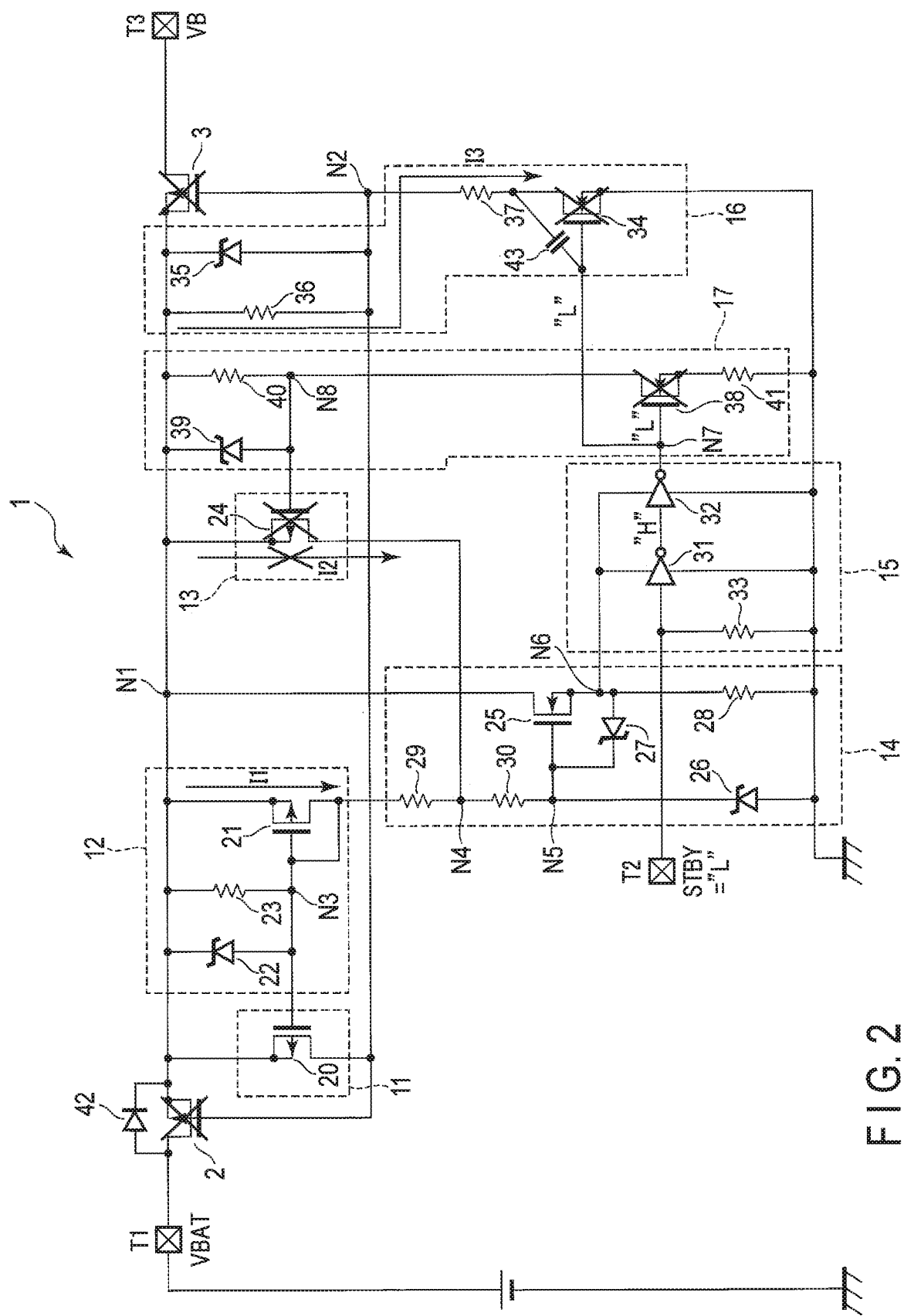
FIG. 2 is a circuit diagram of a power switch circuit according to an embodiment.

First of all, the case (1) in which a positive potential is applied to the terminal T1, and the signal STBY is at the "L"

level will be explained using FIG. 2. FIG. 2 is a circuit diagram of a power switch circuit, in which the main currents are shown by arrows, and a cross mark is added to the transistors that are turned "OFF".

As shown in the drawing, since the transistor 2 is an LDMOSFET, a parasitic diode 42 is present between the source and the drain thereof. The parasitic diode 42 has an anode electrically connected to the terminal T1, and a cathode connected to the node N1. Though not shown, a parasitic diode is also present for the transistor 3, and an anode is electrically connected to the terminal T3, and a cathode is connected to the node N1.

A voltage VBAT is applied to the terminal T1. A forward bias is then applied to the parasitic diode 42, and the parasitic diode 42 is turned "ON". As a result, a voltage V1 (=VBAT−Vt), which is a voltage lower than the voltage VBAT by a forward voltage Vt of the parasitic diode 42 is transferred to the node N1. The transistor 21 of the first current supply circuit 12 is then turned on by the voltage V1. The transistor 21 that is turned "ON" supplies an electric current I1 to a path in which the resistance elements 29 and 30 and the Zener diode 26 of the power voltage generation circuit 14 are connected in series, and causes a potential to be generated at the node N3 to turn on the transistor 20. When the transistor 20 is turned "ON", the node N1 and the node N2 become electrically connected. In other words, the node N1 and the node N2 become approximately the same potential.

Furthermore, the electric current I1 supplied by the transistor 21 flows to the Zener diode 26 of the power voltage generation circuit 14. This causes a positive potential to be generated at the node N5, which turns on the transistor 25. When the transistor 25 is turned on, an electric current flows from the node N1 to the path in which, the transistor 25 and the resistance element 28 are connected in series, and a positive potential is generated at the node N6.

The control logic 15 operates by using the voltage of the node N6, In the present example, since the signal STBY is at the "L" level, the "L" level is output to the node N7. As a result, the transistor 34 of the first gate driver 16 and the transistor 38 of the second gate driver 17 are turned "OFF". Therefore, in addition to the potential of the node N2, the potential of the node N8 also becomes substantially equal to that of the node N1.

As a result of the potential of the node N8 becoming equal to that of the node N1 in the above manner, the transistor 24 of the second current supply circuit 13 is turned "OFF". As mentioned earlier, since the transistor 20 is turned "ON", the potentials between the node N1 and the node N2 become substantially equal. As a result, the transistors 2 and 3 are turned "OFF", and the terminal T1 and the terminal T3 become electrically disconnected.

2.2 Case (2) Above

Figure 3:
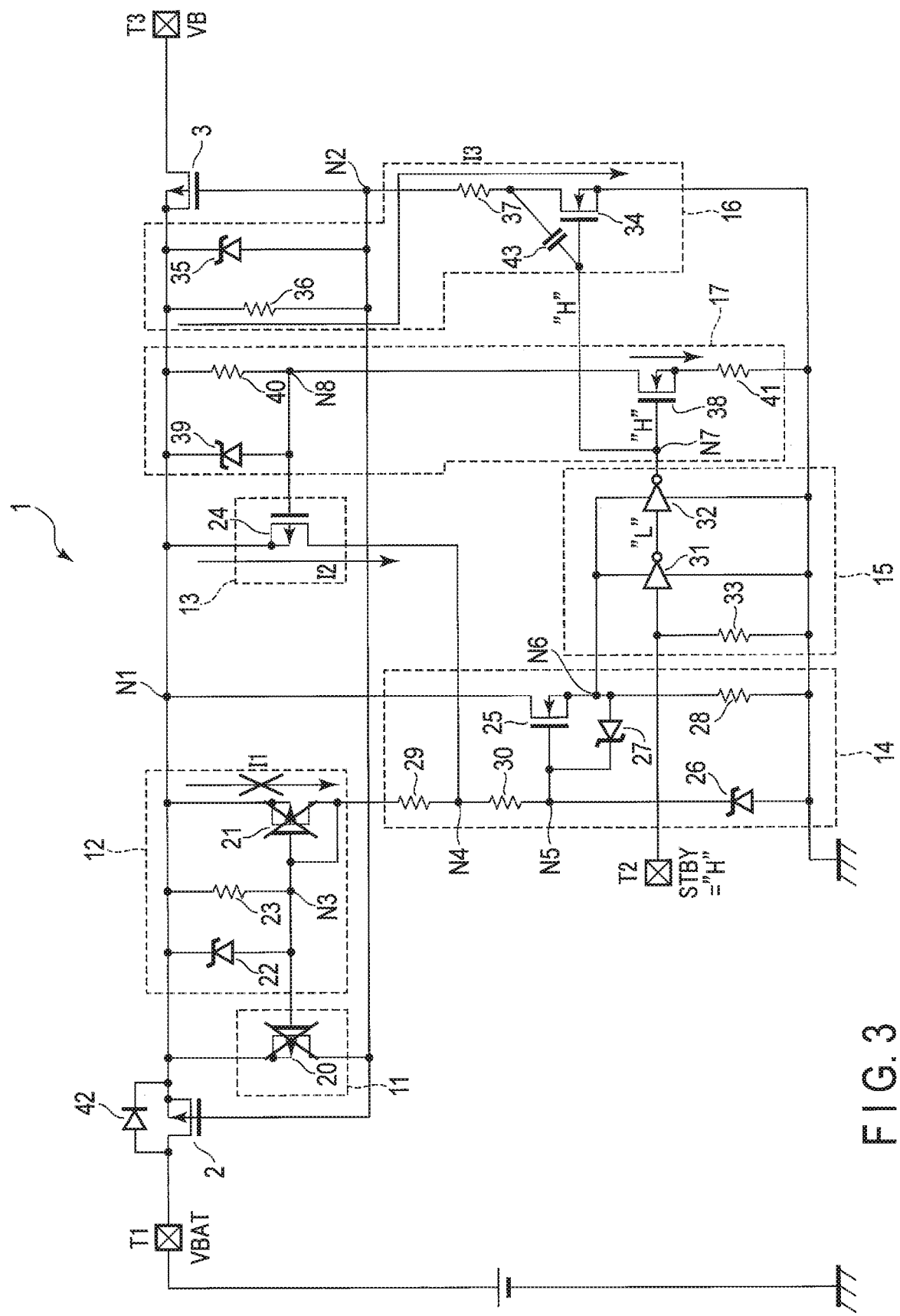
FIG. 3 is a circuit diagram of a power switch circuit according to an embodiment.

A case in which a positive potential is applied to the terminal T1, and the signal STBY is at the "H" level will now be explained using FIG. 3. FIG. 3 is a circuit diagram of the power switch circuit 1, in which, in the same manner as in FIG. 2, the main currents are shown by arrows, and a cross mark is added to the transistors that are turned "OFF". In the following, only the matters different from Case (1) explained in 2.1 above will be explained.

In the present case, since the signal STBY is at the "H" level, the control logic 15 outputs the "H" level to the node N7. Therefore, the transistor 38 of the second gate driver 17 is turned "ON". A voltage drop occurring at the resistance element 40 generates a positive potential at the node N8, which turns "ON" the transistor 24 of the second current supply circuit 13, to supply an electric current I2 to the power voltage generation circuit 14.

When the electric current I2 is supplied to the power voltage generation circuit 14, the voltage drop occurring at the resistance element 30 increases, and the potential of the node N4 rises. As a result, the difference between the potential at the node N1 and the potential at the node N4 becomes small. Thereby, the transistor 21 is turned "OFF". As a result of the transistor 21 being turned "OFF", the potential of the node N3 becomes substantially equal to that of the node N1 by the resistance element 23, and the transistor 20 is turned "OFF".

Since the node N7 is at the "H" level, the transistor 34 is turned "ON" also at the first gate driver 16. Then the voltage VGS is generated between the node N1 and the node N2 by the voltage drop occurring at the resistance element 36, and the transistors 2 and 3 are turned "ON". As a result, the terminal T1 and the terminal T3 become electrically connected. In other words, the voltage VBAT is transferred to the terminal T3 through the transistor 2, the node N1, and the transistor 3.

2.3 Case (3) Above

A case in which a negative potential is applied to the terminal T1 will now be explained.

In the case where a negative potential is applied to the terminal T1, the potentials of the node N1 and the node N2 become high with respect to the potential of the terminal T1. Thereby, transistors 2 and 3 are turned off, and the terminal T1 and the terminal T3 become electrically disconnected.

3. Advantageous Effects of Present Embodiment

The present embodiment is capable of improving operation reliability of a semiconductor device. The effect will be explained below.

The power switch circuit 1 comprising the reverse connection protection function according to the present embodiment comprises the switch 11. During a period in which the transistors 2 and 3 are turned off by the first gate driver 16, the switch 11 electrically connects the node N1 and the node N2. This suppresses the voltage VGS that is a voltage difference between the voltage V1 of the node N1 and a voltage V2 of the node N2 from exceeding threshold voltages of the transistors 2 and 3 even in the case where a voltage with significant temporal changes, that is, a voltage with large dV/dt, is applied to the terminal T1. As a result, the transistors 2 and 3 can be suppressed from being turned on.

Figure 4:
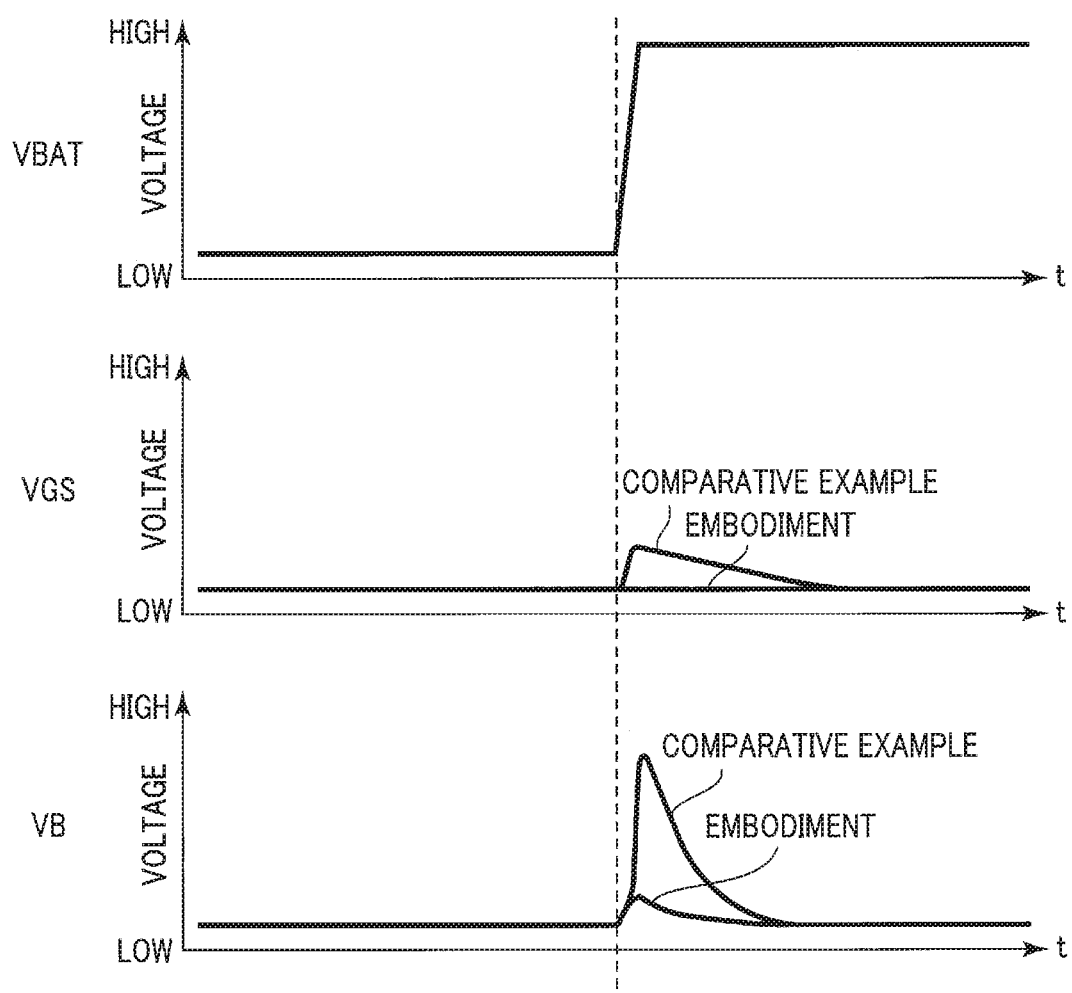
FIG. 4 is a graph showing temporal changes in various voltages in power switch circuits according to an embodiment and a comparative example.

As a comparative example of the present embodiment, a configuration that does not include the switch 11, and connects the node N1 and the node N2 by the resistance element 36 is assumed. In the present configuration, in a period in which the transistors 2 and 3 are turned off by the first gate driver 16, an electric current flowing via the resistance element 36 is supplied to the node N2. This electric current is further supplied to, for example, a capacity 43 between the drain and the gate of the transistor 34. An electric current I3 that charges the capacity 43 via the resistance element 36 generates the voltage VGS when flowing through the resistance element 36. As a result, when the voltage VGS exceeds the threshold voltages of the transistors 2 and 3, the transistors 2 and 3 are turned on, and a voltage is generated at the terminal T3. This aspect will be shown in FIG. 4 in comparison to the case of the present embodiment. FIG. 4 shows changes in the voltage VGS and a voltage VB when the voltage VBAT with large dV/dt is applied to the terminal T1 in a state where the STBY signal is at the "L" level.

As shown in the drawing, in the comparative example, when the voltage VBAT increases, the voltage VGS also increases, and, the voltage VB increases. In comparison, in the present embodiment, when the voltage VBAT increases, the switch 11 electrically connects the node N1 and the node N2. Therefore, even if the voltage VBAT increases, the increase in the voltage VGS can be suppressed, and the increase in the voltage VB can be suppressed.

Furthermore, according to the present embodiment, a consumption current required to control the switch 11 can be suppressed. The power switch circuit 1 comprising the reverse connection protection function according to the present embodiment diverts the electric current I1 supplied by the first current supply circuit 12 at the power voltage generation circuit 14, and generates the power supply voltage for the control logic 15, by the power voltage generation circuit 14 using this electric current. Furthermore, together with the transistor 20, the transistor 21 included in the first current supply circuit 12 configures a current mirror circuit. Therefore, there is no need to have a driver provided separately for turning on the transistor 20 which becomes the switch 11, and the power consumption by the driver can be eliminated. In this manner, useless and unnecessary power consumption can be suppressed, and the power consumption of the power switch circuit 1 can be reduced.

The above matter can be rephrased in the following manner. In the present embodiment, the transistor 20, which is a switch for turning off the transistors 2 and 3, is arranged in a bias path to the Zener diode 26 of the power voltage generation circuit 14, and the second current supply circuit 13 is controlled independently at the second gate driver 17. In addition to a function of increasing bias current to the Zener diode 26, the transistor 24 has a function of enabling the transistors 2 and 3 to be turned on by turning off the transistor 20, which is a switch for turning off the transistors 2 and 3 when the transistor 20 is turn on. Since the first gate driver 16 and the second gate driver 17 are turned off when the STBY signal is at the "L" level, the transistor 24 is turned off, and the transistor 20, which is the switch 11 for turning off the transistors 2 and 3, is turned on. Here, an on-resistance of the transistor 20 can be set to a sufficiently smaller value than a resistance value of the resistance element 36. Therefore, even in a case where a voltage with large dV/dt is applied to the terminal T1, and a current flows in a capacity 43 between the drain and the gate of the transistor 34, the voltage between the gate and the source of the transistors 2 and 3 can be made a smaller value than a threshold value.

In contrast, when the STBY signal is at the "H" level, the transistor 38 of the second gate driver 17 is turned on and causes the transistor 24 to be turned on, the transistor 20 and 21 are turned, off, which, thereby, cuts off the switch 11 for turning off the transistors 2 and 3. Furthermore, the transistor 34 of the first gate driver 16 is also turned on. Therefore, the voltage VGS, which is a voltage between the gate and the source of the transistors 2 and 3, may be expressed by the following equation:

$$VGS=(VBAT*R36)/(R36+R37)$$

Here, R36 is a resistance value of the resistance element 36, and R37 is a resistance value of the resistance element 37. As a result, the transistors 2 and 3 are turned "ON". Since the bias current of the power voltage generation circuit 14 is set by a path from the transistor 24 and the resistance element 30, a bias current value can be set to a desired value by adjusting the resistance value of the resistance element 30.

The above effect is as shown in FIG. 4. In particular, in the comparative example, when a voltage VBAT with a large dV/dt is applied to the terminal T1, the transistors 2 and 3 are erroneously turned on, and a voltage is generated at the terminal T3. In contrast, in the present embodiment, the voltage generated at the terminal T3 is minute, therefore, significant improvement can be seen.

In the manner mentioned above, by providing the transistor 20, which is the switch 11 for turning off the transistors 2 and 3, the transistors 2 and 3 are prevented from being erroneously turned on when a voltage with large dV/dt is applied to the terminal T1, and the voltage generated at the terminal T3 can also be significantly reduced. Furthermore, since the bias path of the bias current from the first current supply circuit 12 to the power voltage generation circuit 14 is diverted as the bias path of the transistor 20, which is the switch 11, consumption current can be suppressed. As mentioned above, in the present embodiment, in the case where a voltage with large dV/dt is applied to the terminal T1 when the STBY signal is at the "L" level, malfunctioning of the transistors 2 and 3 as the power switch and unnecessary power supply to the terminal T3 can be suppressed, without increasing the bias current. Therefore, the power supply destination circuit connected to the terminal T3 can be prevented from malfunctioning.

4. Modification, Etc.

In the above manner, the configuration according to the present embodiment can improve operational reliability of a semiconductor device. However, other than the above embodiment, various modifications are possible. For example, in order to apply a positive potential to the terminal T1, a battery may be connected. Furthermore, as the power supply destination circuit, an active circuit that operates by receiving a potential may be connected to the terminal T3, and the active circuit may be integrated on the same semiconductor substrate together with the power switch circuit explained in the above embodiment. The power switch circuit (and the active circuit) according to an embodiment of the present application may be an on-vehicle IC that is mounted on an automobile.

Various modifications may also be applied to the particulars of each function block. For example, a control logic 15 may include other logic circuits that are not shown, and may control other circuits that are not shown. For example, this may control an on-vehicle IC. Furthermore, the other logic circuits that are not shown may operate only when the STBY signal is at the "H" level. The power voltage generation circuit 14 may supply a power supply voltage to circuits that are not shown in addition to the control logic 15. The power voltage generation circuit 14 may increase an electric current flowing to the Zener diode 26 to enhance stability of the voltage. According to the above embodiments, the transistor 24 supplies the current to the Zener diode 26 when the transistor 20 is off state. Therefore, the current flowing the Zener diode 26 can be increased by enhancing the drivability of the transistor 24.

Various modifications may also be applied on whether or not to dispose each element and the conditions thereof. For example, the Zener diodes 22, 27, 35, and 39 are provided so that, when a voltage between the gate and the source of the transistor rises, the breakdown of the Zener diodes protect the transistors. Therefore, the presence/absence of the Zener diodes may be changed in accordance with conditions in which the circuits are used.

Furthermore, the resistance values of the resistance elements 29 and 30 should be values that turn off the first current supply circuit 12 when the second current supply circuit 13 is turned on. The relationship between the electric current I1 supplied by the first current supply circuit 12 and the electric current I2 supplied by the second current supply circuit 13 should be one in which the first current supply circuit 12 is turned off when the second current supply circuit 13 is turned on. However, relationship such as I2>I1 is desirable in the case of using the power voltage generation circuit 14 that operates with minimum electric current necessary for operating when the signal STBY the "L" level, and that operates with a large amount of electrical current to place importance on stability when the signal STBY is at the "H" level.

In the above embodiment, in the first gate driver 15, the resistance element 37 is connected to the drain of the transistor 34, and, in the second gate driver 17, the resistance element 41 is connected to the source of the transistor 38. However, the resistance elements 37 and 41 may be deleted in a range in which the gate driver can drive a gate of a drive target transistor. Furthermore, a resistance may be inserted between a source of the transistor 34 and a ground potential, or a drain of the transistor 38 and the node N8, in a range in which the gate driver is capable of driving the gate of the drive target transistor. Furthermore, in the above embodiment, a p-type LDMOSFET is used for the transistors 2 and 3, so that the transistors function as a switch when a positive voltage is applied to the terminal T1, and cut off an electric current when a negative voltage is applied to the terminal T1. However, by changing the n-type and p-type of transistors, and a connection direction of the Zener diode, the transistors may function as a switch when a negative voltage is applied to the terminal T1, and cut off an electric current when a positive voltage is applied to the terminal T1.

Figure 5:
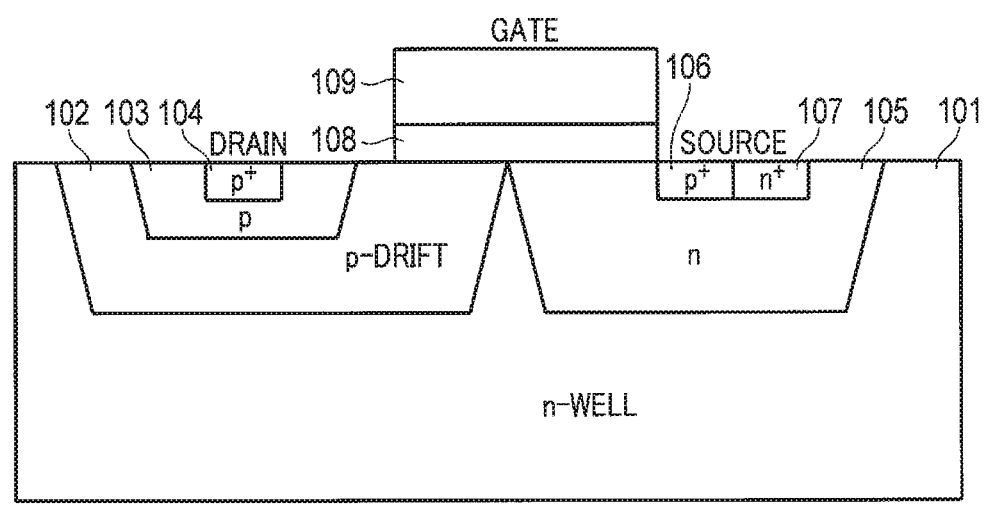
FIG. 5 is a cross-sectional view of an LDMOS according to an embodiment.

FIG. 5 shows an example of a cross-sectional view of a p-type LDMOSFET according to the above embodiment. The p-type LDMOSFET has a p-drift region 102, a p-region 103, and a p$^+$-region 104 that becomes a drain disposed in an n-well region 101. Furthermore, an n-region 105, and a p$^+$-region 106 and a n$^+$-region 107 that become a source are disposed in the n-well region 101. The p$^+$-region 106 and the n$^+$-region 107 are connected by a conductive layer that is not shown. An insulation layer 108 that becomes a gate insulation film and a conductive layer 109 that becomes a gate electrode are disposed on the n-well region between the drain and the source.

The transistors 2 and 3 can, for example, use the above configuration. In such case, the transistors 2 and 3 are subject to element isolation by, for example, a trench. Furthermore, the source of the transistor 2 and the source of the transistor 3 are connected by a conductive layer, and function as the node N1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first transistor including, one end of a current path connected to a first node, another end of the current path connected to a second node, and a gate connected to a third node;
    a second transistor including, one end of a current path connected to the second node, another end of the current path connected to a fourth node, and a gate connected to the third node;
    a switch configured to connect the second node and the third node; and
    a first control circuit configured to control the switch, wherein the first control circuit turns on the switch in a period in which the first transistor and the second transistor are turned off,
    wherein the first control circuit comprises:
    a first current supply circuit including a third transistor that supplies a first current; and
    a first voltage generation circuit that generates and outputs a first voltage based on the first current, wherein
    the switch is controlled based on a gate potential of the third transistor,
    the switch comprises a fifth transistor connected between the second node and the third node, and
    the third transistor and the fifth transistor form a current mirror.

2. The device according to claim 1, wherein the first transistor and the second transistor are connected so that parasitic diodes are faced in opposite directions from each other.

3. The device according to claim 1, wherein
    a back-gate of the first transistor is connected to the second node, and
    a back-gate of the second transistor is connected to the second node.

4. The device according to claim 1, further comprising a first resistance element connected between the second node and the third node.

5. The device according to claim 1, wherein the first control circuit turns off the first transistor and the second transistor by controlling a potential of the third node, and turns off the switch in a period in which the first transistor and the second transistor are turned on.

6. The device according to claim 1, wherein the first node is connected to a battery, and the fourth node is connected to a circuit that is driven by a battery.

7. The device according to claim 1, wherein the first transistor and the second transistor are LDMOSFETs.

8. A semiconductor device comprising:
    a first transistor including, one end of a current path connected to a first node, another end of the current path connected to a second node, and a gate connected to a third node;
    a second transistor including, one end of a current path connected to the second node, another end of the current path connected to a fourth node, and a gate connected to the third node;
    a switch configured to connect the second node and the third node; and
    a first control circuit configured to control the switch, wherein the first control circuit turns on the switch in a period in which the first transistor and the second transistor are turned off, wherein the first control circuit comprises:
a first current supply circuit including a third transistor that supplies a first current;
a second current supply circuit including a fourth transistor that supplies a second current; and
a first voltage generation circuit that generates and outputs a first voltage based on the first current or the second current, wherein
the third transistor is turned off by turning on the fourth transistor and supplying the second current to the first voltage generation circuit, and
the switch isolates the second node and the third node by turning off the third transistor.

9. The device according to claim 8, wherein the first transistor and the second transistor are connected so that parasitic diodes are faced in opposite directions from each other.

10. The device according to claim 8, wherein
a back-gate of the first transistor is connected to the second node, and
a back-gate of the second transistor is connected to the second node.

11. The device according to claim 8, further comprising a first resistance element connected between the second node and the third node.

12. The device according to claim 8, wherein the first control circuit turns off the first transistor and the second transistor by controlling a potential of the third node, and turns off the switch in a period in which the first transistor and the second transistor are turned on.

13. The device according to claim 8, wherein
the first current supply circuit supplies the first current to the first voltage generation circuit via a second resistance element and a third resistance element connected in series, and
the second current supply circuit supplies the second current to a connection node between the second resistance element and the third resistance element.

14. The device according to claim 8, wherein the second current is larger than the first current.

15. The device according to claim 8, wherein
the first control circuit further comprises a first driver that drives the third node, and a second driver that drives a gate of the fourth transistor, and
the first and the second drivers are controlled based on a control signal.

16. The device according to claim 8, wherein
the switch comprises a fifth transistor connected between the second node and the third node, and
the third transistor and the fifth transistor form a current mirror.

17. The device according to claim 8, wherein the first node is connected to a battery, and the fourth node is connected to a circuit that is driven by a battery.

18. The device according to claim 8, wherein the first transistor and the second transistor are LDMOSFETs.

* * * * *